United States Patent [19]

Eagan et al.

[11] Patent Number: 5,303,191
[45] Date of Patent: Apr. 12, 1994

[54] MEMORY WITH COMPENSATION FOR VOLTAGE, TEMPERATURE, AND PROCESSING VARIATIONS

[75] Inventors: John W. Eagan; Scott G. Nogle; Ruey J. Yu, all of Austin, Tex.

[73] Assignee: Motorola, Inc., Schaumburg, Ill.

[21] Appl. No.: 824,666

[22] Filed: Jan. 23, 1992

[51] Int. Cl.⁵ .............................................. G11C 13/00
[52] U.S. Cl. ................................... 365/194; 365/211; 365/189.09; 307/591; 307/594; 307/296.1
[58] Field of Search ............... 307/591, 592, 597, 603, 307/605, 606, 263, 296.1; 365/194, 189.09, 211, 212

[56] References Cited

U.S. PATENT DOCUMENTS

| | | | |
|---|---|---|---|
| 4,110,842 | 8/1978 | Sarkssian et al. | 365/211 |
| 4,577,296 | 3/1986 | Wong | 365/211 |
| 4,622,482 | 11/1986 | Ganger | 307/585 |
| 4,636,983 | 2/1987 | Young et al. | 365/189.09 |
| 4,661,928 | 4/1987 | Yasuoka | 307/263 |
| 4,758,743 | 7/1988 | Dehganpour et al. | 307/443 |
| 4,866,675 | 9/1989 | Kawashima | 365/194 |
| 4,882,507 | 11/1989 | Tatsumi et al. | 365/194 |
| 4,977,337 | 12/1990 | Ohbayashi et al. | 307/263 |
| 5,017,807 | 5/1991 | Kriz et al. | 307/263 |
| 5,068,553 | 11/1991 | Love | 307/605 |
| 5,130,582 | 7/1992 | Ishihara et al. | 307/591 |

Primary Examiner—Eugene R. LaRoche
Assistant Examiner—Vu Le
Attorney, Agent, or Firm—Paul J. Polansky; James L. Clingan, Jr.

[57] ABSTRACT

A memory (30) includes input buffers (35, 38, 56), decoders (31, 32, 36), and a memory portion (34). The input buffers (35, 38, 56) include a delay circuit (82) which delays at least one transition of an input signal. The delay circuit (82) includes a compensation circuit (250) which compensates the delay circuit (82) for voltage, temperature, and processing variations. In one embodiment, the delay circuit (82) includes a CMOS inverter (102, 103) with an additional transistor (101) coupled between a source of an inverter transistor (102) and a corresponding power supply voltage. The compensation circuit (250) provides a bias voltage to bias a gate of the transistor (101) to determine the delay of the delay circuit (82). The compensation circuit (250) provides the bias voltage as that voltage which biases the transistor (101) to conduct a precision reference current.

25 Claims, 6 Drawing Sheets

MEMORY WITH COMPENSATION FOR VOLTAGE, TEMPERATURE, AND PROCESSING VARIATIONS

CROSS REFERENCE TO RELATED, COPENDING APPLICATIONS

Related, copending applications are application Ser. No. 07/561,400, filed 01 Aug. 1990, by Scott G. Nogle and assigned to the assignee hereof, entitled "A BICMOS Logic Circuit with Self Boosting Immunity and a Method Therefor," and application Ser. No. 07/610,172, filed 05 Nov. 1990 by Scott G. Nogle and Perry Pelley and assigned to the assignee hereof, entitled "A Low DI/DT BICMOS Output Buffer with Improved Speed."

FIELD OF THE INVENTION

This invention relates generally to memories, and more particularly, to memories with compensation for voltage, temperature, and processing variations.

BACKGROUND OF THE INVENTION

A recurring concern for an integrated circuit memory designer is how to design the memory to operate according to timing specifications across wide variations in operating parameters. The designer must make critical tradeoffs of signal timing in order to simultaneously satisfy two specifications. For example, one important specification is address access time, designated "$t_{AVQV}$", defined as the delay from a valid input address to valid output data during a read cycle. In order to begin the access, an address buffer must present a valid internal address to row and column decoders. Eventually the row and column decoders select one or more memory cells. Minimizing the delay through the address buffer improves $T_{AVQV}$.

At the same time, it is necessary to avoid an unintended write to an address location by maintaining the valid internal address for a specified length of time in relation to when a write input signal becomes inactive. This specification is known as write recovery time or "$t_{WHAX}$". In order for the memory to easily interface to other integrated circuits, it is desirable for the $t_{WHAX}$ specification to be as small as possible. Increasing the delay through the address buffer improves $t_{WHAX}$. The actual delay through the address input buffer reflects the tradeoff between $t_{AVQV}$ and $t_{WHAX}$; the delay is designed to meet both specifications with enough margin at nominal design parameters so that when the actual parameters vary, a large fraction of the integrated circuits manufactured can meet the specifications.

Three types of operating parameters are of particular concern: power supply voltage, temperature, and processing parameters. Integrated circuit memories are typically designed for a nominal power supply voltage of 5.0 volts, with a variation of 10% or more. At lower power supply voltages, complementary metal-oxide-semiconductor (CMOS) and bipolar-CMOS (BICMOS) logic circuits, used in most memories, generally operate slower than at higher power supply voltages. Temperature also affects circuit performance. Integrated circuit memories are typically designed to operate from zero to seventy degrees Celsius. A temperature increases, the resistivity of doped silicon increases, leading to a decrease in switching speed of CMOS and BICMOS circuits. Several processing parameters also affect circuit operation by affecting transistor switching speed. In CMOS and BICMOS integrated circuits, one processing parameter of particular importance is the effective CMOS transistor channel length, known as "$L_{EFF}$". As $L_{EFF}$ increases, CMOS and BICMOS logic circuits generally become slower.

Faster speed is generally, but not universally, desirable. In the case of the $t_{AVQV}/t_{WHAX}$ specifications, faster speed improves $t_{AVQV}$ but worsens $t_{WHAX}$. High voltage and low temperature define a "fast corner", in which the address signals reach the decoders the fastest. At the fast corner, $t_{AVQV}$ improves over nominal conditions (everything else being equal), but $t_{WHAX}$ worsens and may even be violated. On the other hand, low voltage and high temperature define a "slow corner", in which the address signals reach the decoders the slowest. At the slow corner, $t_{WHAX}$ improves over nominal conditions (everything else being equal), but $t_{AVQV}$ may be violated. When processing parameters vary, it becomes even more difficult to meet the timing specifications. Thus, designing for nominal operating conditions such as 5.0 volts and 25 degrees Celsius is often inadequate to ensure high manufacturing yield.

Known memories improve $t_{WHAX}$ and similar specifications by adding delays in the input signal paths. The delays change the internal signal timings to optimize the tradeoff between two specifications. As memories become faster, known delay circuits are becoming inadequate to meet the specifications. Since the delay of the delay circuit itself varies with changes in voltage, temperature, and processing, the variability with respect to operating conditions remains. As memories become faster, it is increasingly difficult for the circuit designer to meet more and more stringent timing specifications. The circuit designer needs to be able to design memories which operate according to specification over wide variations in voltage, temperature, and processing.

SUMMARY OF THE INVENTION

Accordingly, there is provided, in one form, a memory with compensation for voltage, temperature, and processing variations comprising input means, a memory portion, and decoding means. The input means receives a plurality of input signals, and provides a plurality of internal signals in response thereto. The memory portion stores a plurality of memory bits at locations determined by a plurality of decoded signals. The decoding means is coupled to the input means and to the memory portion and activates at least one of the plurality of decoded signals in response to the plurality of internal signals. The input means includes means for delaying at least one transition of at least one of the internal signals, for a first delay the delaying means including means for compensating the delaying means to keep the first delay substantially constant with respect to voltage, temperature, and processing variations.

These and other features and advantages will be more clearly understood from the following detailed description taken in conjunction with the accompanying drawings.

DETAILED DESCRIPTION OF THE INVENTION

Figure 1:
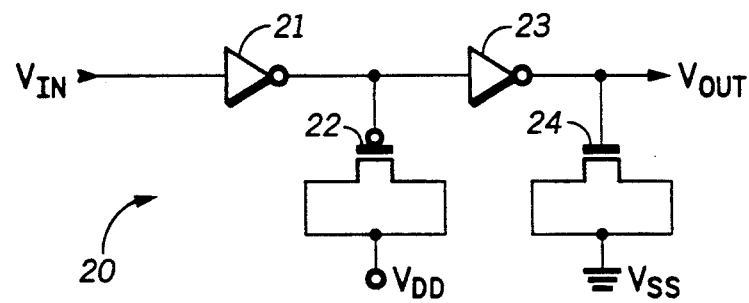
FIG. 1 illustrates in schematic form a first delay circuit known in the prior art.

FIG. 1 illustrates in schematic form a first delay circuit 20 known in the prior art. Delay circuit 20 is an example of a delay circuit which may be used in input signal buffers to help an integrated circuit memory achieve timing specifications, and illustrates problems with this technique. Delay circuit 20 includes an inverter 21, a transistor 22 configured as a capacitor, an inverter 23, and a transistor 24 configured as a capacitor. Inverter 21 has an input terminal for receiving an input voltage labelled "$V_{IN}$", and an output terminal. Transistor 22 has a gate connected to the output terminal of inverter 21, and a source and drain connected together and to a power supply voltage terminal labelled "$V_{DD}$". $V_{DD}$ is a more-positive power supply voltage terminal typically at a nominal voltage of 5.0 volts. Inverter 23 has an input terminal connected to the output terminal of inverter 21, and an output terminal for providing an output signal labelled "$V_{OUT}$". Transistor 24 has a gate connected to the output terminal of inverter 23, and a source and drain connected together and to a power supply voltage terminal labelled "$V_{SS}$". $V_{SS}$ is a more-negative power supply voltage terminal typically at zero volts. Delay circuit 20 may be used to optimize the timing of the internal signals to better match nominal operating conditions, but still has a delay which varies with respect to power supply voltage, temperature, and processing variations. For example, inverters 21 and 23 are CMOS inverters. If P-channel transistors in inverters 21 and 23 each have a gate width-to-gate length ratio of 15 microns ($\mu$)/0.8$\mu$, and N-channel transistors in inverters 21 and 23 each have a gate width-to-gate length ratio of 10$\mu$/0.8$\mu$, and transistors 22 and 24 each have a gate width-to-gate length ratio of 40$\mu$/0.8$\mu$, then the delay from the slow corner to the fast corner varies by about 0.96 nanoseconds (ns.). In a memory with an access time of approximately 10 ns., such a variability is very undesirable.

Figure 2:
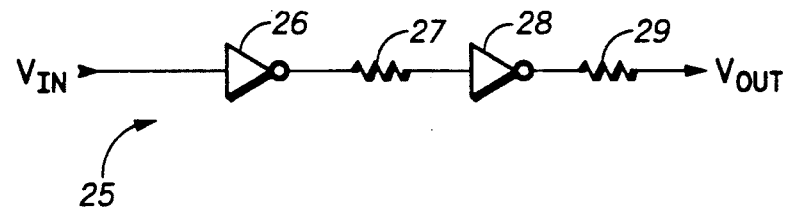
FIG. 2 illustrates in schematic form a second delay circuit known in the prior art.

FIG. 2 illustrates in schematic form a second delay circuit 25 known in the prior art. Delay circuit 25 includes an inverter 26, a resistor 27, an inverter 28, and a resistor 29. Inverter 26 has an input terminal for receiving $V_{IN}$, and an output terminal. Resistor 27 has a first terminal connected to the output terminal of inverter 26, and a second terminal. Inverter 28 has an input terminal connected to the second terminal of resistor 27, and an output terminal. Resistor 29 has a first terminal connected to the output terminal of inverter 28, and a second terminal for providing signal $V_{OUT}$. Delay circuit 25, like delay circuit 20, may be used to optimize the timing of the internal signals to better match nominal operating conditions, but still has a delay which varies with respect to power supply voltage, temperature, and processing variations. If P-channel transistors in inverters 26 and 28 each have a gate width-to-gate length ratio of 15$\mu$/0.8$\mu$, and N-channel transistors in inverters 26 and 28 each have a gate width-to-gate length ratio of 10$\mu$/0.8$\mu$, and if resistors 27 and 29 each have a value of about 5 kilohms, then the delay from the slow corner to the fast corner varies by about 0.89 ns. This variability is also undesirable.

A delay circuit disclosed in U.S. Pat. No. 5,068,553, entitled "Delay Stage with Reduced $V_{dd}$ Dependence," by A. Love is a variation of circuits 20 and 25 of FIG. 1, and provides a longer delay on a high-to-low transition of the input signal than on a low-to-high transition. However, the circuit disclosed by Love does not completely solve the problem of voltage dependence and does not address the problem of variation in delay with variations in temperature and processing parameters. Since Love's circuit still relies on process-variant CMOS characteristics, the variation from the fast corner to the slow corner is still present.

Figure 3:
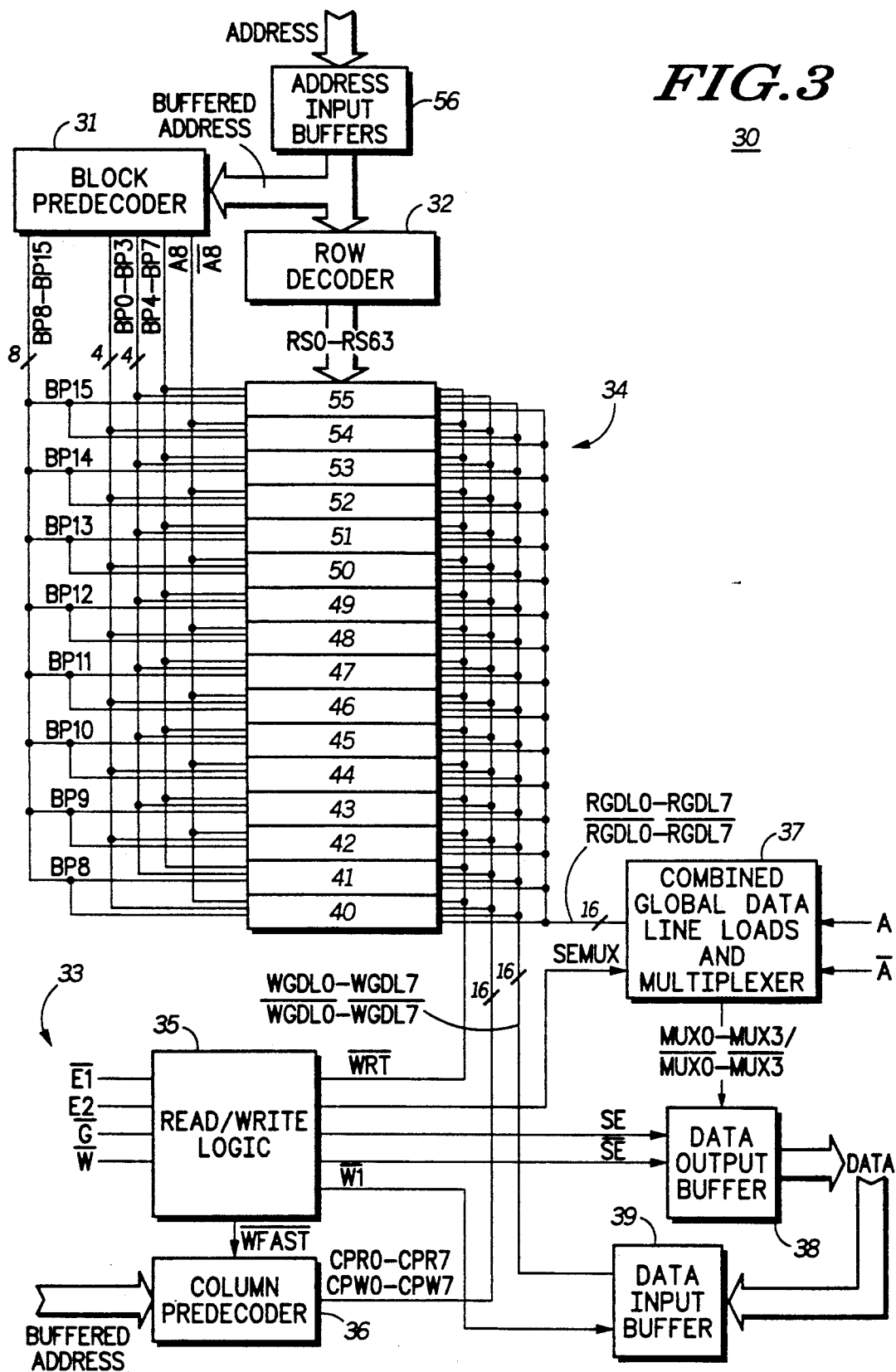
FIG. 3 illustrates in block form a memory with compensation for voltage, temperature, and processing variations in accordance with the present invention.

FIG. 3 illustrates in block form a memory 30 having compensation for voltage, temperature, and processing variations in accordance with the present invention. FIG. 3 shows features pertinent to understanding the present invention, but omits other features. Memory 30 comprises generally a block predecoder 31, a row decoder 32, an input/output portion 33, a memory block portion 34, and address input buffers 56. Input/output portion 33 comprises a read/write logic block 35, a column predecoder 36, a combined global data line loads and multiplexer portion 37, a data output buffer 38, and a data input buffer 39. Memory block portion 34 comprises a plurality of memory blocks; in the illustrated embodiment, memory block portion 34 comprises sixteen memory blocks 40–55.

Address input buffers 56 receive a first portion of a plurality of address signals labelled "ADDRESS" and provide a plurality of corresponding signals labelled "BUFFERED ADDRESS" in response. Block predecoder 31 receives a first portion of BUFFERED ADDRESS and provides predecoded block signals labelled "A8", "$\overline{A8}$", "BP0-BP3", "BP4-BP7", and "BP8-BP15" in response. A particular memory block receives a unique combination of predecoded block signals which determines when the block is selected. Even-numbered memory blocks receive A8, whereas odd-numbered blocks receive $\overline{A8}$; memory blocks 40 and 41, 42 and 43, 44 and 45, 46 and 47, 48 and 49, 50 and 51, 52 and 53, and 54 and 55 respectively receive signals BP8, BP9, BP10, BP11, BP12, BP13, BP14, and BP15. Even-numbered memory blocks receive BP0-BP3, whereas odd-numbered memory blocks receive BP4-BP7, for further decoding. Row decoder 32 receives a second portion of BUFFERED ADDRESS and provides row select signals labelled "RS0-RS63" in response. RS0-RS63 are provided to each memory block.

Read/write logic block 35 receives as inputs an active-low enable signal labelled "$\overline{E1}$", an optional active-high enable signal labelled "E2", an output enable signal labelled "$\overline{G}$", and a write enable signal labelled "$\overline{W}$".

Read/write logic block 35 provides a write signal labelled "$\overline{\text{WRT}}$" to each of memory blocks 40–55, a multiplexer select signal labelled "SEMUX" to combined global data line loads and multiplexer 37, select signals labelled "SE" and "$\overline{\text{SE}}$" to data output buffer 38, and a control signal labelled "$\overline{\text{W1}}$" to data input buffer 39 in response to the input signals referred to above. $\overline{\text{WRT}}$ is a buffered signal indicating a write cycle is in progress. SEMUX is an active-high select signal which is active during a read cycle. SE and $\overline{\text{SE}}$ are respectively active-high and active-low signals enabling data output buffer 38. $\overline{\text{W1}}$ is a signal indicating that a write cycle is in progress. Read/write logic block 35 also provides a write signal labelled "$\overline{\text{WFAST}}$" to column predecoder 36.

Column predecoder 36 receives signal $\overline{\text{WFAST}}$ and a second portion of BUFFERED ADDRESS and provides a plurality of predecoded column signals labelled "CPR0–CPR7" and "CPW0–CPW7" in response. Combined global data line loads and multiplexer 37 receive buffered address signals labelled "A" and "$\overline{\text{A}}$" and couple to each of 8 differential global data line pairs labelled "RGDL0-RGDL7" and "$\overline{\text{RGDL0-RGDL7}}$". Combined global data line loads and multiplexer 37 provide output signals labelled "MUX0–MUX3" and "$\overline{\text{MUX0-MUX3}}$" in response. Data output buffer 38 couples to MUX0–MUX3 and $\overline{\text{MUX0-MUX3}}$ and provides one or more data signals labelled "DATA" in response. The number of signals in DATA corresponds to the number of output signal pairs provided by combined global data line loads and multiplexer 37. Here there are four output signal pairs provided by combined global data line loads and multiplexer 37, and thus four output signals provided on DATA. Hence the organization of memory 30 is X4. The number of data bits provided by memory 30 may vary in different embodiments so the number of data signals in DATA is left indeterminate to illustrate this. Data input buffer 39 receives DATA and provides 8 write data line signal pairs labelled "WGDL0-WGDL7" and "$\overline{\text{WGDL0-WGDL7}}$" in response. Note that since memory 30 is X4, data input buffer 39 will only drive four signal pairs of the group WGDL0–WGDL7 and $\overline{\text{WGDL0-WGDL7}}$. The multiplexing of these signals is not shown in FIG. 3.

Memory 30 is capable of performing read and write cycles. Memory 30 is organized as 16 blocks, with each block organized as 256 rows and 64 columns. A function which can be considered row decoding uses the first portion of the address to enable one block and to enable one local word line in the block. Thus, row decoding decodes one of 4096 local word lines in memory 30. The row decoding function encompasses block predecoder 31 and row decoder 32. A local word line is enabled in an enabled memory block in response to RS0–RS63 and a plurality of predecoded block signals received from block predecoder 31. Column decoding decodes eight bit line pairs out of 64 bit line pairs on the enabled local word line. Row redundancy is also possible but is not shown in FIG. 3. Multiplexing is performed by a single buffered address bit and its complement, A and $\overline{\text{A}}$. Since the organization of memory 30, and the portions of the input address used for particular decoding, may be altered in different embodiments, ADDRESS, A, and $\overline{\text{A}}$ are designated generically.

In the read cycle, signals $\overline{\text{E1}}$ or E2 are asserted and signal $\overline{\text{W}}$ is negated. In an alternative embodiment, either signal $\overline{\text{E1}}$ may be connected to $V_{SS}$ or signal E2 may be connected to $V_{DD}$ so that the remaining one becomes the chip select signal. Read/write logic block 35 keeps signals $\overline{\text{WRT}}$, $\overline{\text{WFAST}}$, and $\overline{\text{W1}}$ negated. Block predecoder 31 selectively asserts signals A8, $\overline{\text{A8}}$, and BP0–BP15 in response to the first portion of BUFFERED ADDRESS. Row decoder 32 selectively asserts a row select signal of RS0–RS63 in response to the second portion of BUFFERED ADDRESS. The memory block selected by the predecoded signals A8, $\overline{\text{A8}}$, and a corresponding signal from the group BP8–BP15, then uses the remaining predecoded signals BP0–BP7, along with an active row select signal of RS0–RS63, to activate one local word line. Then within the selected block, each memory cell on the activated local word line provides its contents onto a corresponding differential bit line pair. Further column decoding among the bit line pairs is performed using CPR0–CPR7. The type of cycle in progress determines which signal is asserted, either one of CPR0–CPR7 for a read cycle, or one of CPW0–CPW7 for a write cycle. During the read cycle, one signal of CPR0–CPR7 is asserted to select one of eight bit line pairs in a selected memory block to output on a corresponding global data line pair. Thus, CPR0–CPR7 decode 8 of 64 bit lines. Eventually, eight bit line pairs are selected. A selected memory cell thus is located at an intersection of an enabled local word line and a selected bit line pair, in an enabled memory block.

The differential voltage on each of the eight selected bit line pairs is received and sensed by combined global data line loads and multiplexer 37. During the read cycle, read/write logic 35 activates signal SEMUX to enable combined global data line loads and multiplexer 37. When selected, combined global data line loads and multiplexer 37 performs two functions: first, the output of the memory blocks, a differential current, is converted into a differential voltage. Second, four of eight global data line signals are multiplexed and provided as signals MUX0–MUX3 and $\overline{\text{MUX0-MUX3}}$. The data bits represented differentially as MUX0–MUX3 and $\overline{\text{MUX0-MUX3}}$ are then provided externally to memory 30 by data output buffer 38, enabled by signals SE and $\overline{\text{SE}}$.

In the write cycle, the flow of data is essentially reversed. Read write logic 35 activates signals $\overline{\text{WFAST}}$ to column predecoder 36 begin column address decoding. Read/write logic 35 also activates signals $\overline{\text{WRT}}$ and $\overline{\text{W1}}$. Data input buffer 39 receives DATA and provides four data bits differentially onto corresponding write global data line pairs in response. As noted earlier, multiplexing of DATA as an input during the write cycle is not shown in FIG. 3. Since memory 30 is organized to store or provide four data bits of memory per access, DATA is provided on four pairs of the eight differential write global data line pairs WGDL0-WGDL7 and $\overline{\text{WGDL0-WGDL7}}$. Signals CPW0–CPW7 from column predecoder 36 are used in a selected memory block to perform column decoding to couple the four write global data lines to four bit line pairs. During the write cycle, one signal of CPW0–CPW7 is asserted to select one of eight bit line pairs in a selected memory block to output on a corresponding global data line pair. Thus, CPW0–CPW7 decode 8 of 64 bit lines. The local word line decoding occurs in the same manner as for the read cycle. The differential voltage developed on the bit line pairs is much larger for the write cycle than for the read cycle in order to overwrite the contents of the selected memory cells.

To be sold commercially, memory 30 must meet several timing specifications. To have high manufacturing yield, memory 30 must be designed to meet the timing specifications over wide ranges of voltage, temperature, and processing. Meeting all the specifications simultaneously requires internal control signals, generated from the input signals, to arrive at internal logic circuits within certain ranges of time. Thus, there are intrinsic tradeoffs in the ability of memory 30 to meet the specifications. However, address input buffers 56, read/write logic 35, and data input buffer 39 delay certain transitions of corresponding input signals more than other transitions to improve the tradeoffs. Furthermore, address input buffers 56, read/write logic 35, and data input buffer 39 include controlled delay circuits with compensation, described below, to reduce the variability in signal timings due to voltage, temperature, and processing parameters.

TABLE I illustrates several critical timing specifications and groups them in pairs to represent the tradeoffs. One tradeoff involves $t_{AVQV}$ versus $t_{WHAX}$. In order to meet the $t_{AVQV}$ specification, address input buffers 56 must provide BUFFERED ADDRESS quickly to block predecoder 31 and row decoder 32. (Since the $t_{AVQV}/t_{WHAX}$ tradeoff is not as constrained for column decoding as for block and row decoding for the architecture of memory 30, it is not necessary for memory 30 to include buffers similar to address input buffers 56 to buffer the column address.) However, to meet $t_{WHAX}$, address information must not be provided so quickly at the fast corner that a write to the new (incorrect) address occurs. Memory 30 meets these two specifications simultaneously by including a delay from ADDRESS to BUFFERED ADDRESS which is longer for a select transition (low-to-high) of each BUFFERED ADDRESS signal than for a deselect transition and which has compensation for changes in voltage, temperature, and processing.

TABLE I

| SPECIFICATION | DESCRIPTION |
| --- | --- |
| $t_{AVQV}$ | ADDRESS valid to DATA out valid |
| $t_{WHAX}$ | $\overline{W}$ high to ADDRESS invalid (write recovery) |
| $t_{WLWH}$ | $\overline{W}$ low to $\overline{W}$ high ($\overline{W}$ pulse width) |
| $t_{AVWL}$ | ADDRESS valid to $\overline{W}$ low (address setup time) |
| $t_{WHQV}$ | $\overline{W}$ high to DATA out valid (output access from $\overline{W}$) |
| $t_{WHQX}$ | $\overline{W}$ high to DATA out driven (output active from $\overline{W}$) |
| $t_{ELQV}$ | $\overline{E1}$ low to DATA out valid (output access from $\overline{E1}$) |
| $t_{ELQX}$ | $\overline{E1}$ low to DATA out driven (output active from $\overline{E1}$) |
| $t_{DVWH}$ | DATA in valid to $\overline{W}$ high (data setup time) |
| $t_{WHDX}$ | $\overline{W}$ high to DATA in invalid (data hold time) |

A second tradeoff is $t_{WLWH}$ versus $t_{AVWL}$. To meet $t_{WLWH}$, read/write logic 35 must begin the start of a write cycle quickly at the slow corner. To meet $t_{AVWL}$, the start of the write cycle must not happen too quickly at the fast corner. Read/write logic 35 meets the two specifications simultaneously by including a delay from $\overline{W}$ to signals $\overline{WRT}$, $\overline{WFAST}$, and $\overline{W1}$ which is compensated for voltage, temperature, and processing variations.

A third tradeoff is $t_{WHQV}$ versus $t_{WHQX}$. To meet $t_{WHQV}$, DATA output must be valid quickly at the slow corner. $t_{WHQV}$ must also be less than or equal to $t_{AVQV}$. To meet $t_{WHQX}$, DATA output must not be driven by data output buffer 38 too quickly at the fast corner. Read/write logic 35 meets the two specifications simultaneously by including a delay from $\overline{W}$ to signals SE and $\overline{SE}$ which is slower for a selected transition (low-to-high transition of signal SE) and which is compensated for voltage, temperature, and processing variations.

A fourth tradeoff is $t_{ELQV}$ versus $t_{ELQX}$. To meet $t_{ELQV}$, DATA out must be provided quickly at the slow corner. To meet $t_{ELQX}$, DATA out must not be provided too quickly at the fast corner. Read/write logic 35 meets the two specifications simultaneously by including a delay from signals $\overline{E1}$ or E2 to signals SE and $\overline{SE}$ which is compensated for voltage, temperature, and processing variations.

A fifth tradeoff is $t_{DVWH}$ versus $t_{WHDX}$. To meet $t_{DVWH}$, data input buffer 39 must provide data quickly to memory block portion 34 at the slow corner to minimize write cycle time. To meet $t_{WHDX}$, data input buffer 39 must not provide data too quickly to memory block portion 34 at the fast corner or else new, incorrect data will be written over the correct data. Data input buffer 39 meets these two specifications simultaneously by including a delay from DATA to corresponding internal signals which is compensated for changes in voltage, temperature, and processing.

Figure 4:
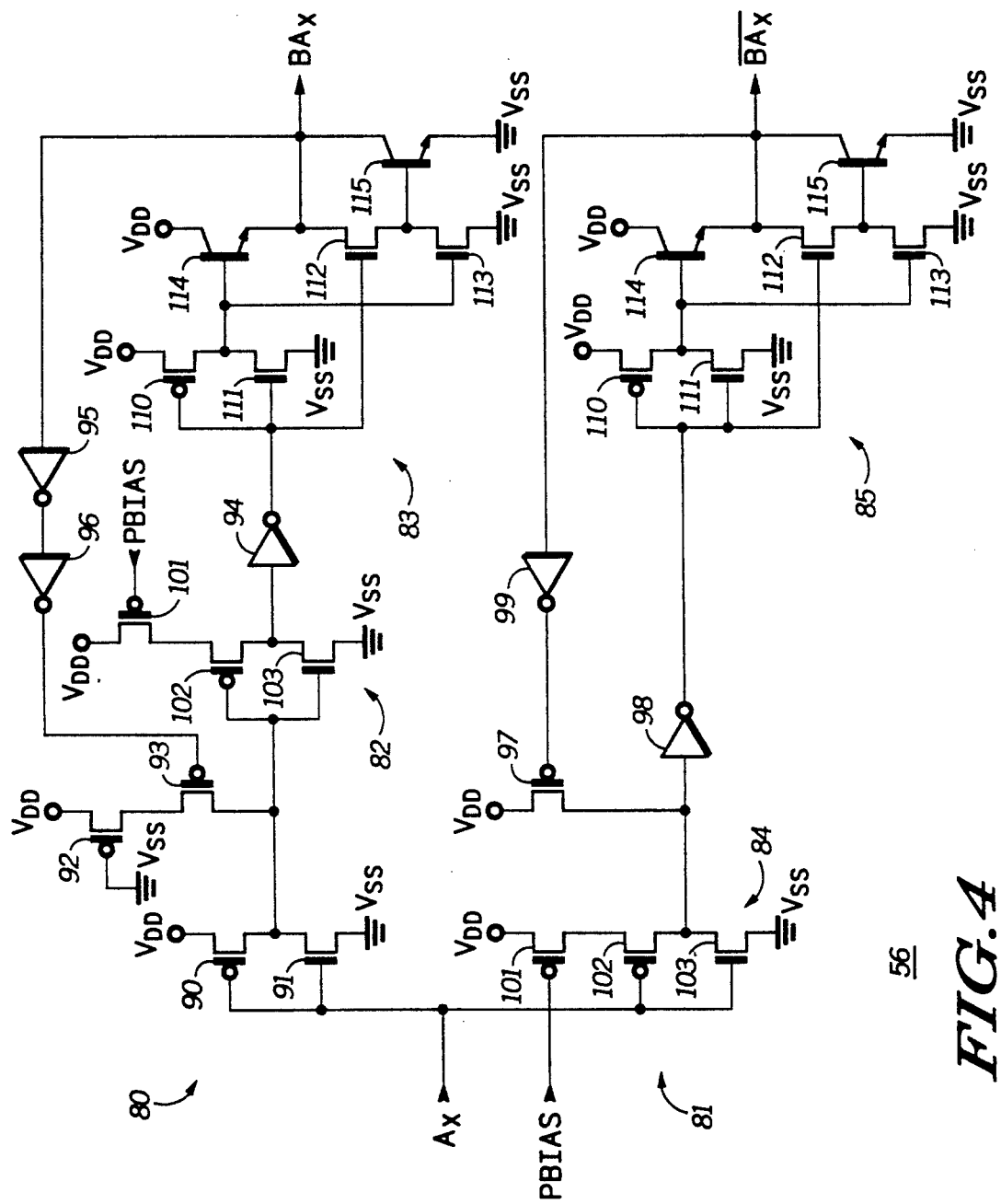
FIG. 4 illustrates in partial schematic form and partial block form one of address input buffers 56 of FIG. 3.

FIG. 4 illustrates in partial schematic form and partial block form one of address input buffers 56 of FIG. 3. The address input buffer shown in FIG. 4 is also designated 56, although address input buffers 56 include several buffers, some of which are similar to buffer 56 of FIG. 4 as described below. Buffer 56 receives an address input signal designated generically as "$A_X$" and provides true and complement buffered address signals labelled "$B_{AX}$" and "$\overline{B_{AX}}$", respectively. Buffer 56 includes a true logic portion 80, and a complement logic portion 81. True logic portion 80 includes a controlled delay circuit 82, and a BICMOS inverter/driver circuit 83. True logic portion 80 also includes a P-channel transistor 90, an N-channel transistor 91, P-channel transistors 92 and 93, and inverters 94, 95, and 96. Complement logic portion 81 includes a controlled delay circuit 84, and a BICMOS inverter/driver circuit 85. Complement logic portion 81 also includes a P-channel transistor 97, and inverters 98 and 99.

In true logic portion 80, transistor 90 has a source connected to $V_{DD}$, a gate for receiving signal $A_X$, and a drain. Transistor 91 has a drain connected to the drain of transistor 90, a gate for receiving signal $A_X$, and a source connected to $V_{SS}$. Transistor 92 has a source connected to $V_{DD}$, a gate connected to $V_{SS}$, and a drain. Transistor 93 has a source connected to the drain of transistor 92, a gate, and a drain connected to the drain of transistor 90. Controlled delay circuit 82 has an input terminal connected to the drains of transistors 90 and 93, and an output terminal. Inverter 94 has an input terminal connected to the output terminal of controlled delay circuit 82, and an output terminal. BICMOS inverter/driver 83 has an input terminal connected to the output terminal of inverter 94, and an output terminal providing output signal $B_{AX}$. Inverter 95 has an input terminal connected to the output terminal of BICMOS inverter/driver 83, and an output terminal. Inverter 96 has an input terminal connected to the output terminal of inverter 95, and an output terminal connected to the gate of transistor 93.

Controlled delay circuit 82 includes P-channel transistors 101 and 102, and an N-channel transistor 103. Transistor 101 has a source connected to $V_{DD}$, a gate for receiving a bias voltage labelled "PBIAS", and a drain. Transistor 102 has a source connected to the drain of transistor 101, a gate providing the input terminal of controlled delay circuit 82, and a drain providing the output terminal of controlled delay circuit 82. Transistor 103 has a drain connected to the drain of transistor 102, a gate also providing the input terminal of controlled delay circuit 82 and connected to the gate of transistor 102, and a source connected to $V_{SS}$.

BICMOS inverter/driver 83 includes a P-channel transistor 110, N-channel transistors 111, 112, and 113, and NPN transistors 114 and 115. Transistor 110 has a source connected to $V_{DD}$, a gate providing the input terminal of BICMOS inverter/driver 83, and a drain. Transistor 111 has a drain connected to the drain of transistor 110, a gate also providing the input terminal of BICMOS inverter/driver 83 and connected to the gate of transistor 110, and a source connected to $V_{SS}$. Transistor 112 has a drain connected to the output terminal of BICMOS inverter/driver 83, a gate connected to the input terminal of BICMOS inverter/driver 83, and a source. Transistor 113 has a drain connected to the source of transistor 112, a gate connected to the drain of transistor 110, and a source connected to $V_{SS}$. Transistor 114 has a collector connected to $V_{DD}$, a base connected to the drain of transistor 110, and an emitter connected to the drain of transistor 112 and providing an output signal $BA_X$ thereon. Transistor 115 has a collector connected to the emitter of transistor 114, a base connected to the source of transistor 112, and an emitter connected to $V_{SS}$.

In complement logic portion 81, controlled delay circuit 84 has an input terminal for receiving signal $A_X$, and an output terminal. Controlled delay circuit 84 is similar to controlled delay circuit 82 and includes transistors having the same reference numbers. Transistor 97 has a source connected to $V_{DD}$, a gate, and a drain connected to the output terminal of controlled delay circuit 84. Inverter 98 has an input terminal connected to the output terminal of controlled delay circuit 84, and an output terminal. BICMOS inverter/driver circuit 85 has an input terminal connected to the output terminal of inverter 98, and an output terminal for providing signal $\overline{BA_X}$. BICMOS inverter/driver circuit 85 is identical to BICMOS inverter/driver circuit 83 and includes transistors having the same reference numbers. Inverter 99 has an input terminal connected to the output terminal of BICMOS inverter/driver circuit 85, and an output terminal connected to the gate of transistor 97.

True logic portion 80 includes buffering through four inverting stages to output signal $BA_X$. This output signal is fed back through inverters 95 and 96 to the gate of transistor 93, which latches a high-to-low transition of $A_X$. Complementary logic portion 81 provides only three levels of inversion between $A_X$ and $\overline{BA_X}$, but latches a high-to-low transition of $A_X$ as a logic high on $\overline{BA_X}$.

Address input buffer 56 adds a controlled delay only for a low-to-high transition of either signal $BA_X$ or $\overline{BA_X}$, and thus allows memory 30 to better meet $t_{AVQV}$ and $t_{WHAX}$ simultaneously. As the input of controlled delay circuit 82 falls, transistor 103 becomes nonconductive and transistor 102 becomes conductive. However, the source of transistor 102 is connected to $V_{DD}$ through transistor 101. The gate of transistor 101 is biased by PBIAS, limiting the amount of current provided to subsequent inverter 94. PBIAS is a gate-to-source bias voltage which biases a reference P-channel transistor to conduct a reference current. Thus, it is preferred for the gate length of transistor 101 to equal that of the reference transistor in a compensation circuit which generates PBIAS, illustrated in FIG. 9 below. As temperature, voltage, or processing conditions vary, PBIAS is compensated to equal that voltage which biases the reference transistor to conduct the reference current. Controlled delay circuit 82 has a negligible difference in delay time on the rising edge of the output of circuit 82 from the slow corner to the fast corner, compared to 0.96 ns. and 0.89 ns. for delay circuits 20 and 25 of FIGS. 1 and 2, respectively. By including delay circuits 82 and 84, address buffer 56 is able to achieve an overall improvement of about 0.5 ns. in the $t_{WHAX}/t_{AVQV}$ tradeoff.

Figure 5:
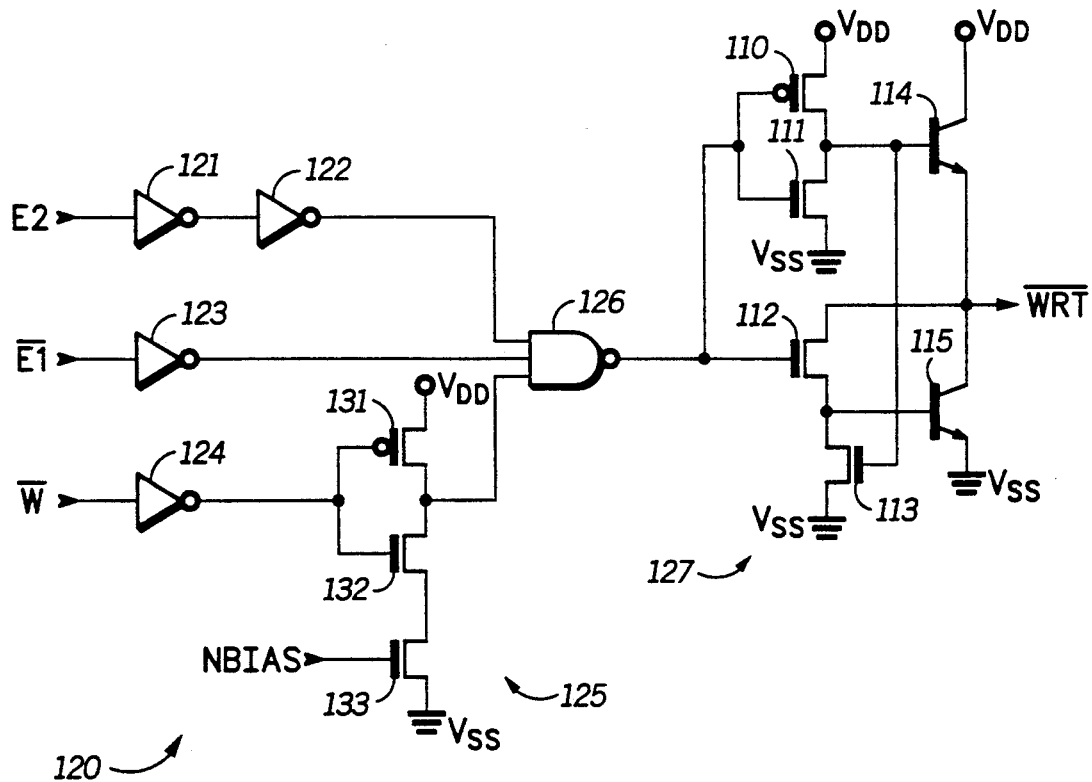
FIG. 5 illustrates in partial schematic form and partial block form a first portion of the read/write logic circuit of FIG. 3.

FIG. 5 illustrates in partial schematic form and partial block form a first portion 120 of read/write logic circuit 35 of FIG. 3. Portion 120 includes inverters 121–124, a controlled delay circuit 125, a NAND gate 126, and a BICMOS inverter/driver circuit 127. Inverter 121 has an input terminal for receiving signal E2, and an output terminal. Inverter 122 has an input terminal connected to the output terminal of inverter 121, and an output terminal. Inverter 123 has an input terminal for receiving signal $\overline{E1}$, and an output terminal. Inverter 124 has an input terminal for receiving signal $\overline{W}$, and an output terminal. Controlled delay circuit 125 has an input terminal connected to the output terminal of inverter 124, and an output terminal. NAND gate 126 has a first input terminal connected to the output terminal of inverter 122, a second input terminal connected to the output terminal of inverter 123, a third input terminal connected to the output terminal of controlled delay circuit 125, and an output terminal. BICMOS inverter/driver circuit 127 has an input connected to the output of NAND gate 126, and an output terminal for providing signal $\overline{WRT}$.

Controlled delay circuit 125 includes a P-channel transistor 131 and N-channel transistors 132 and 133. Transistor 131 has a source connected to $V_{DD}$, a gate providing an input terminal of controlled delay circuit 125, and a drain for providing the output terminal of controlled delay circuit 125. Transistor 132 has a drain connected to the drain of transistor 131, a gate connected to the gate of transistor 131, and a source. Transistor 133 has a drain connected to the source of transistor 132, a gate for receiving a bias voltage labelled "NBIAS", and a source connected to $V_{SS}$. BICMOS inverter/driver circuit 127 is similar to circuit 83 of FIG. 4 and includes transistors having the same reference numbers.

Controlled delay circuit 125 operates analogously to controlled delay circuit 82 of FIG. 4. As the input of controlled delay circuit 125 rises, transistor 131 becomes nonconductive and transistor 132 becomes conductive. However, the source of transistor 132 is connected to $V_{SS}$ through transistor 133. The gate of transistor 133 is biased by NBIAS, limiting the amount of current provided to the third input terminal of NAND gate 126. NBIAS is a gate-to-source bias voltage which biases a reference N-channel transistor to conduct a reference current. As temperature, voltage, or processing conditions vary, NBIAS is compensated to equal that voltage which biases the reference transistor to conduct the reference current. Thus, it is preferred for the gate length of transistor 133 to equal that of the reference transistor in a compensation circuit which generates NBIAS, illustrated in FIG. 10 below. By including delay circuit 125, portion 120 is able to achieve an overall improvement of about 0.5 ns. in the $t_{WLWH}$ and $t_{AVWL}$ tradeoff.

Figure 6:
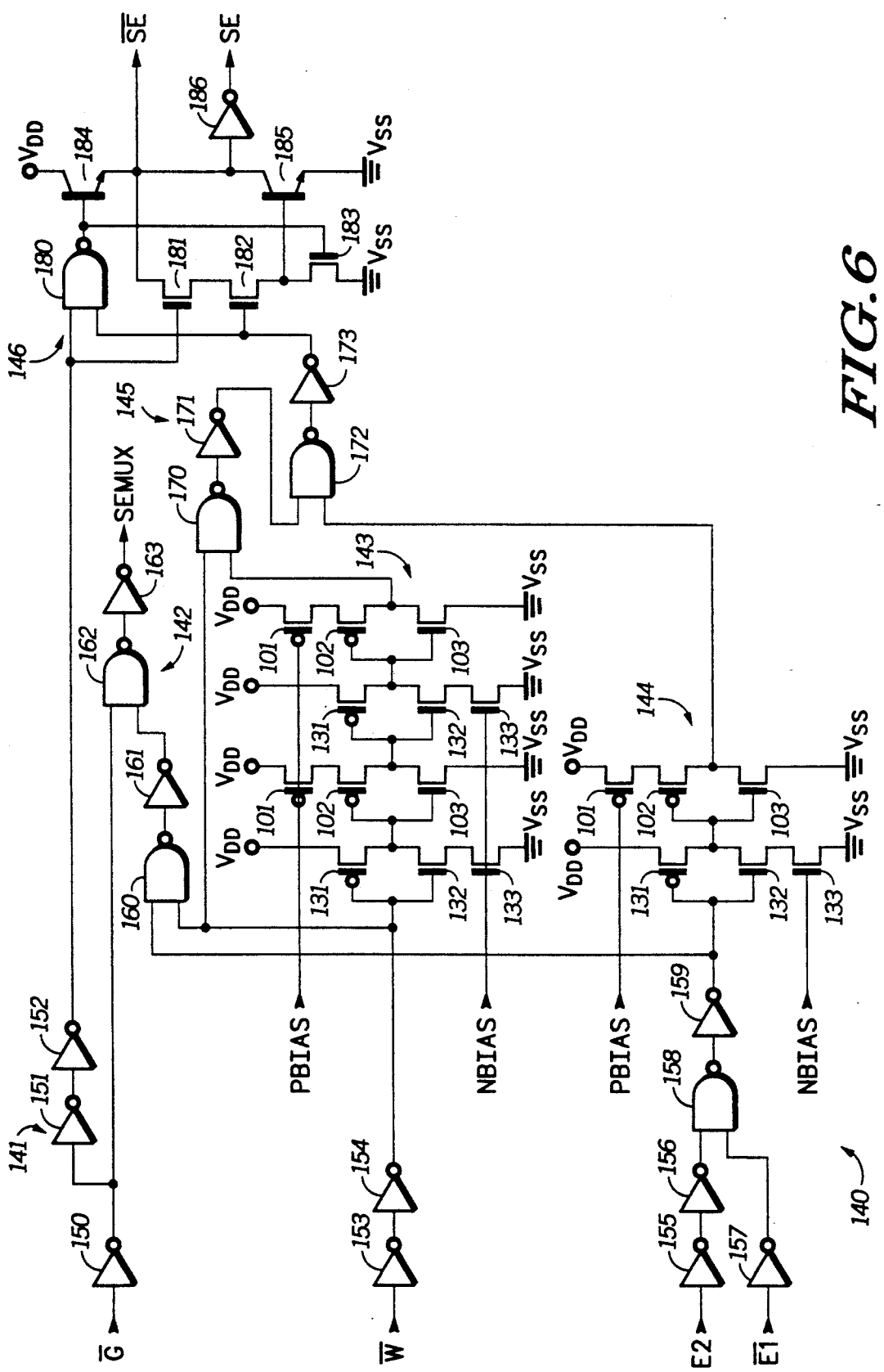
FIG. 6 illustrates in partial schematic form and partial block form a second portion of the read/write logic circuit of FIG. 3.

FIG. 6 illustrates in partial schematic form and partial block form a second portion 140 of read/write logic circuit 35 of FIG. 3. Portion 140 includes generally an input portion 141, a multiplex select signal portion 142, a first delay circuit 143, a second delay circuit 144, a logic circuit 145, and a BICMOS NAND gate/driver circuit 146.

Input portion 141 includes inverters 150-157, a NAND gate 158, and an inverter 159. Inverter 150 has an input terminal for receiving signal $\overline{G}$, and an output terminal. Inverter 151 has an input terminal connected to the output terminal of inverter 150, and an output terminal. Inverter 152 has an input terminal connected to the output terminal of inverter 151, and an output terminal. Inverter 153 has an input terminal for receiving signal $\overline{W}$, and an output terminal. Inverter 154 has an input terminal connected to the output terminal of inverter 153, and an output terminal. Inverter 155 has an input terminal for receiving signal E2, and an output terminal. Inverter 156 has an input terminal connected to the output terminal of inverter 155, and an output terminal. Inverter 157 has an input terminal for receiving signal $\overline{E1}$, and an output terminal. NAND gate 158 has a first input terminal connected to the output terminal of inverter 156, a second input terminal connected to the output terminal of inverter 157, and an output terminal. Inverter 159 has an input terminal connected to the output terminal of NAND gate 158, and an output terminal.

Multiplex select signal portion 142 includes a NAND gate 160, an inverter 161, a NAND gate 162, and an inverter 163. NAND gate 160 has a first input terminal connected to the output terminal of inverter 159, a second input terminal connected to the output terminal of inverter 154, and an output terminal. Inverter 161 has an input terminal connected to the output terminal of NAND gate 160, and an output terminal. NAND gate 162 has a first input terminal connected to the output terminal of inverter 150, a second input terminal connected to the output terminal of inverter 161, and an output terminal. Inverter 163 has an input terminal connected to the output terminal of NAND gate 162, and an output terminal for providing signal SEMUX.

Delay circuit 143 has an input terminal connected to the output terminal of inverter 154, and an output terminal. Delay circuit 143 includes four inverter sections corresponding alternately to controlled delay circuit 125 of FIG. 5 and controlled delay circuit 82 of FIG. 4. Delay circuit 144 has an input terminal connected to the output terminal of inverter 159, and an output terminal. Delay circuit 144 includes two inverter sections corresponding alternately to controlled delay circuit 125 of FIG. 5 and controlled delay circuit 82 of FIG. 4.

Logic circuit 145 includes a NAND gate 170, an inverter 171, a NAND gate 172, and an inverter 173. NAND gate 170 has a first input terminal connected to the output terminal of inverter 154, a second input terminal connected to the output terminal of delay circuit 143, and an output terminal. Inverter 171 has an input terminal connected to the output terminal of NAND gate 170, and an output terminal. NAND gate 172 has a first input terminal connected to the output terminal of inverter 171, a second input terminal connected to the output terminal of delay circuit 144, and an output terminal. Inverter 173 has an input terminal connected to the output terminal of NAND gate 172, and an output terminal.

BICMOS NAND gate/driver circuit 146 includes a NAND gate 180, N-channel transistors 181, 182, and 183, NPN transistors 184 and 185, and an inverter 186. NAND gate 180 has a first input terminal connected to the output terminal of inverter 152, a second input terminal connected to the output terminal of inverter 173, and an output terminal. Transistor 181 has a drain for providing signal $\overline{SE}$, a gate connected to the output terminal of inverter 152, and a source. Transistor 182 has a drain connected to the source of transistor 181, a gate connected to the output of inverter 173, and a source. Transistor 183 has a drain connected to the source of transistor 182, a gate connected to the output terminal of NAND gate 180, and a source connected to $V_{SS}$. Transistor 184 has a collector connected to $V_{DD}$, a base connected to the output terminal of NAND gate 180, and an emitter connected to the drain of transistor 181. Transistor 185 has a collector connected to the emitter of transistor 184, a base connected to the drain of transistor 183, and an emitter connected to $V_{SS}$. Inverter 186 has an input terminal connected to the emitter of transistor 184, and an output terminal for providing signal SE.

Signal SEMUX, when active, enables output data multiplex circuitry in combined global data line loads and multiplexer 37 of FIG. 3. Signals SE and $\overline{SE}$ enable data output buffer 38 of FIG. 3, and are activated in response to signal $\overline{G}$ being active, memory 30 being enabled (by the activation of both signals $\overline{E1}$ and E2), and write enable signal $\overline{W}$ being inactive. Delay circuit 143 provides a single-sided delay only which results in a significant improvement in the $t_{WHQV}/t_{WHQX}$ (and $t_{ELQV}/t_{ELQX}$) tradeoff. When signal $\overline{W}$ makes a low-to-high transition, the output of inverter 154 also changes from a logic low to a logic high. Thus, the first input of NAND gate 170 is at a logic high, and the second input terminal is at a logic low, keeping the output of NAND gate 170 at a logic high. As the input terminal of delay circuit 143 changes from a logic low to a logic high, transistor 133, compensated by voltage NBIAS, limits the current provided to the input of the next delay stage. Similarly, the next delay stage limits the low-to-high transition of its output, and so on. Thus the low-to-high transition at the output of delay circuit 143 is delayed in a manner which, as previously described, is compensated for voltage, temperature, and processing variations. The output of NAND gate 170 remains at a logic high until its second input terminal also switches to a logic high.

Delay circuit 143 in conjunction with NAND gate 170 delays the activation of signals SE and $\overline{SE}$ after a low-to-high transition of signal $\overline{W}$, but does not delay the deactivation of signals SE and $\overline{SE}$ after a high-to-low transition of signal $\overline{W}$. Thus, the activating transitions of signals SE and $\overline{SE}$ are delayed only after a low-to-high transition of write enable signal $\overline{W}$, resulting in about a 2.0 ns. improvement in the $t_{WHQV}/t_{WHQX}$ tradeoff. Similarly, delay circuit 144 delays the activation of signals SE and $\overline{SE}$ after a high-to-low transition of signal $\overline{E1}$ (assuming signal E2 is active). Portion 140 provides approximately a 1.0 ns. improvement in the $t_{ELQV}/t_{ELQX}$ tradeoff.

Figure 7:
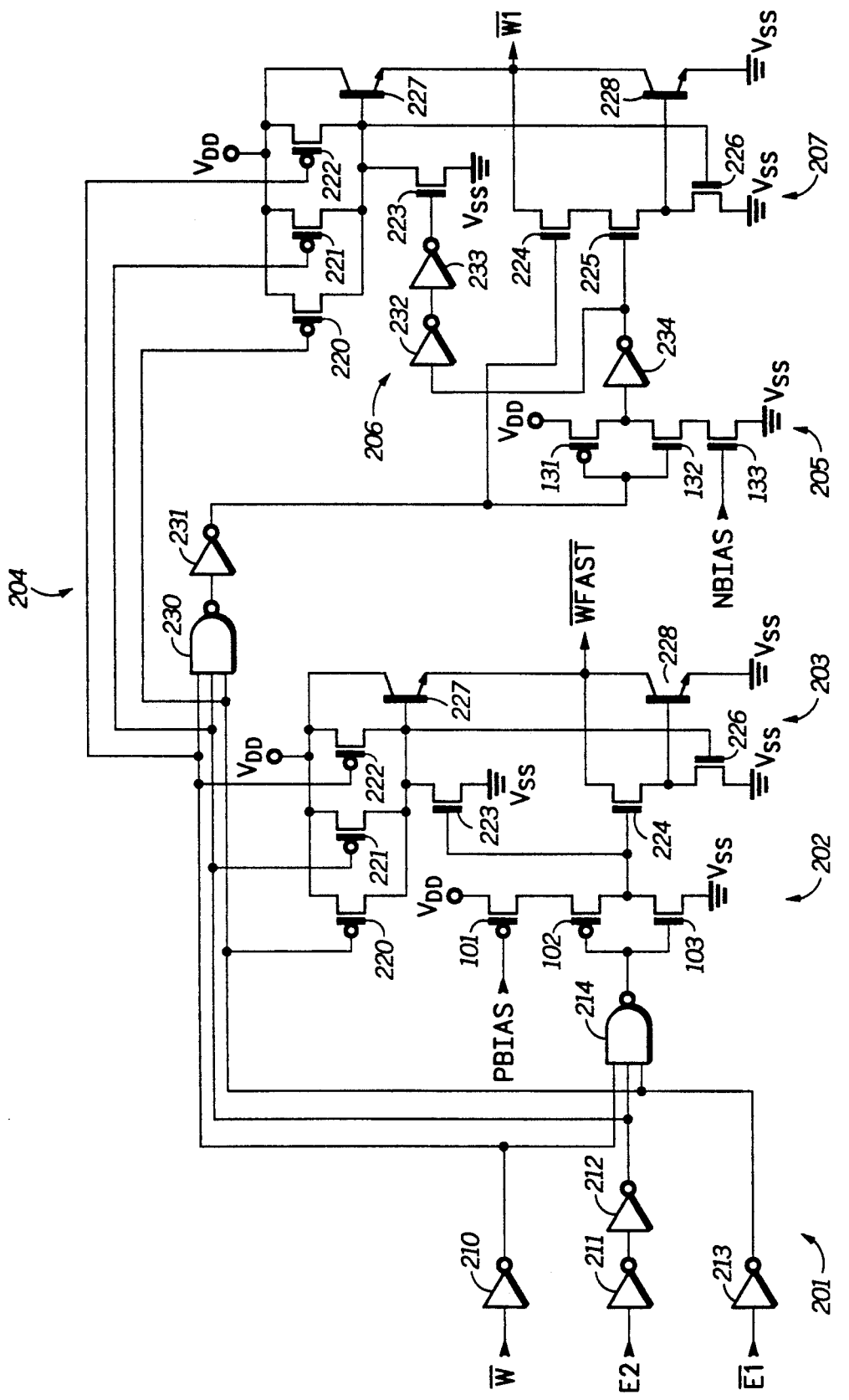
FIG. 7 illustrates in partial schematic form and partial block form a third portion of the read/write logic circuit of FIG. 3.

FIG. 7 illustrates in partial schematic form and partial block form a third portion 200 of read/write logic circuit 35 of FIG. 3. Portion 200 includes generally an input portion 201, a controlled delay circuit 202, a BICMOS NAND gate 203, a first logic portion 204, a controlled delay circuit 205, a second logic portion 206, and a BICMOS NAND gate 207.

Input portion 201 includes inverters 210–213, and a NAND gate 214. Inverter 210 has an input terminal for receiving signal $\overline{W}$, and an output terminal. Inverter 211 has an input terminal for receiving signal E2, and an output terminal. Inverter 212 has an input terminal connected to the output terminal of inverter 211, and an output terminal. Inverter 213 has an input terminal for receiving signal $\overline{E1}$, and an output terminal. NAND gate 214 has a first input terminal connected to the output terminal of inverter 210, a second input terminal connected to the output terminal of inverter 212, a third input terminal connected to the output terminal of inverter 213, and an output terminal.

Controlled delay circuit 202 has an input terminal connected to the output terminal of NAND gate 214, and an output terminal. Controlled delay circuit 202 is similar to controlled delay circuit 82 of FIG. 4 and includes transistors having the same reference numbers.

BICMOS NAND gate 203 includes P-channel transistors 220, 221, and 222, N-channel transistors 223, 224, and 226, and NPN transistors 227 and 228. Transistor 220 has a source connected to $V_{DD}$, a gate connected to the output terminal of inverter 213, and and a drain. Transistor 221 has a source connected to $V_{DD}$, a gate connected to the output terminal of inverter 212, and a drain connected to the drain of transistor 220. Transistor 222 has a source connected to $V_{DD}$, a gate connected to the output terminal of inverter 210, and a drain connected to the drains of transistors 220 and 221. Transistor 223 has a drain connected to the drains of transistors 220, 221, and 222, a gate connected to the output terminal of controlled delay circuit 202, and a source connected to $V_{SS}$. Transistor 224 has a drain for providing output signal $\overline{WFAST}$, a gate connected to the output terminal of controlled delay circuit 202, and a source. Transistor 226 has a drain connected to the source of transistor 224, a gate connected to the drains of transistors 220, 221, and 222, and a source connected to $V_{SS}$. Transistor 227 has a collector connected to $V_{DD}$, a base connected to the drains of transistors 220, 221, and 222, and an emitter connected to the drain of transistor 224. Transistor 228 has a collector connected to the emitter of transistor 227, a base connected to the drain of transistor 226, and an emitter connected to $V_{SS}$.

First logic portion 204 includes a NAND gate 230 and an inverter 231. NAND gate 230 has a first input terminal connected to the output terminal of inverter 210, a second input terminal connected to the output terminal of inverter 212, a third input terminal connected to the output terminal of inverter 213, and an output terminal. Inverter 231 has an input terminal connected to the output terminal of NAND gate 230, and an output terminal.

Controlled delay circuit 205 has an input terminal connected to the output terminal of inverter 231, and an output terminal. Controlled delay circuit 205 is similar to controlled delay circuit 125 of FIG. 5 and includes transistors having the same reference numbers.

Second logic portion 206 includes inverters 232, 233, and 234. Inverter 232 has an input terminal and an output terminal. Inverter 233 has an input terminal connected to the output terminal of inverter 232, and an output terminal. Inverter 234 has an input terminal connected to the output terminal of controlled delay circuit 205, and an output terminal connected to the input terminal of inverter 232.

BICMOS NAND gate 207 is similar to BICMOS NAND gate 203, and similar elements are assigned the same reference numbers. In BICMOS NAND gate 207, the source of transistor 224 is connected instead to a drain of an additional N-channel transistor 225. The drain of transistor 226 is connected instead to a source of transistor 225. A gate of transistor 225 is connected to the output terminal of inverter 234. The gate of transistor 223 is connected instead to the output terminal of inverter 233. The gate of transistor 224 is instead connected to the output terminal of inverter 231. BICMOS NAND gate 207 provides signal $\overline{W1}$ as an output.

Signal $\overline{WFAST}$ enables column predecoder 36 of FIG. 1 and is activated in response to write enable signal $\overline{W}$ and chip select signals $\overline{E1}$ and E2 all being active. Transistor 101 in controlled delay circuit 202 limits the rise time thereof and delays transistors 223 and 224 becoming conductive. Thus, if signals $\overline{E1}$ and E2 are active, portion 200 delays a high-to-low transition of signal $\overline{WFAST}$ from a high-to-low transition of $\overline{W}$. Signal $\overline{W1}$ enables write drivers in data input buffer 39 of FIG. 3 and has the same logical relation to input signals $\overline{W}$, $\overline{E1}$, and E2 as signal $\overline{WFAST}$. Controlled delay circuit 205 in conjunction with transistor 225 provide an additional delay on the high-to-low transition of signal $\overline{W1}$. Overall, portion 200 provides approximately 0.5 ns. improvement in the $t_{WLWH}/t_{AVWL}$ tradeoff.

Figure 8:
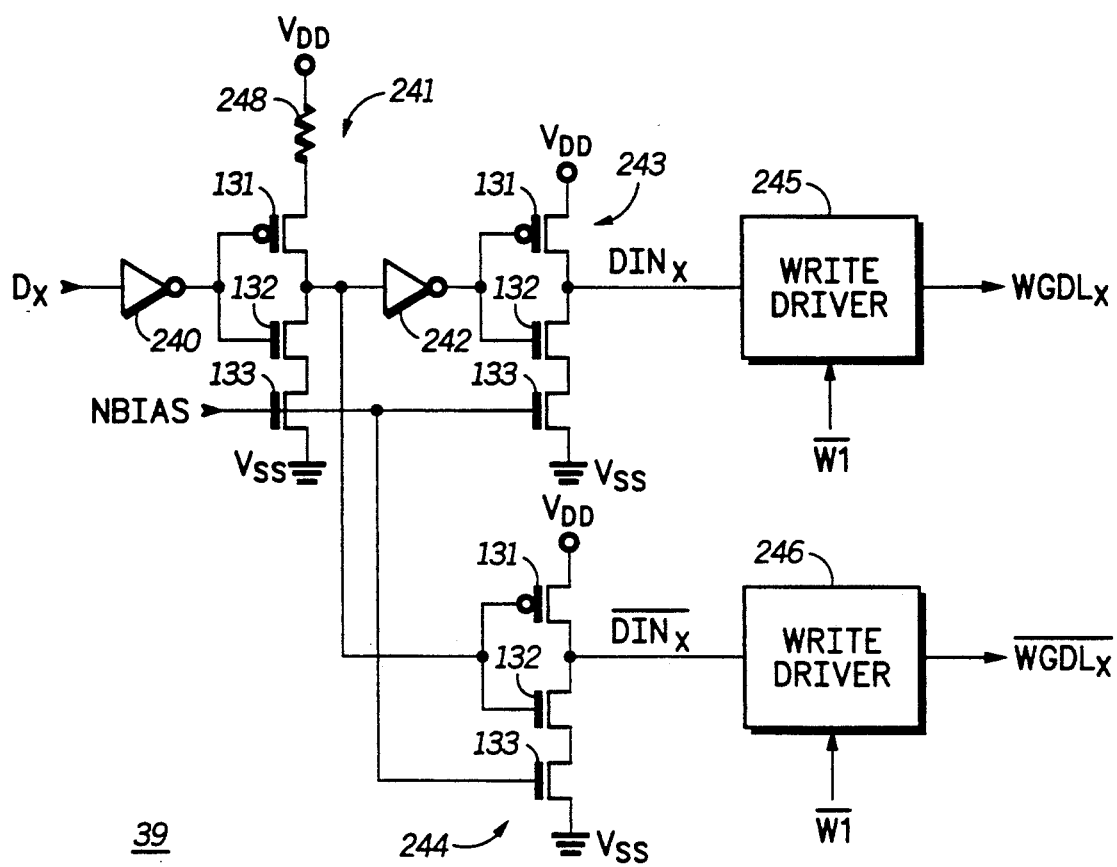
FIG. 8 illustrates in partial schematic form and partial block form the data input buffer of FIG. 3.

FIG. 8 illustrates in partial schematic form and partial block form data input buffer 39 of FIG. 3. Data input buffer 39 includes generally an inverter 240, a modified controlled delay circuit 241, an inverter 242, a controlled delay circuit 243, a controlled delay circuit 244, a write driver circuit 245, and a write driver circuit 246. Inverter 240 has an input terminal for receiving a data input signal labelled "D$_X$", and an output terminal. Signal D$_X$ is one of the signals of DATA. Modified controlled delay circuit 241 has an input terminal connected to the output terminal of inverter 240, and an output terminal. Modified controlled delay circuit 241 is similar to controlled delay circuit 125 of FIG. 5, except the source of transistor 131 is connected instead to a second terminal of a resistor 248. A first terminal of resistor 248 is connected to $V_{DD}$. Inverter 242 has an input terminal connected to the output terminal of modified controlled delay circuit 241, and an output terminal. Controlled delay circuit 243 has an input terminal connected to the output terminal of inverter 242, and an output terminal for providing a signal labelled "DIN$_X$". Controlled delay circuit 243 is similar to controlled delay circuit 125 of FIG. 5 and includes transistors having the same reference numbers. Controlled delay circuit 244 has an input terminal connected to the output terminal of modified controlled delay circuit 241, and an output terminal for providing a signal labelled "$\overline{DIN_X}$". Controlled delay circuit 244 is similar to controlled delay circuit 125 of FIG. 5 and includes transistors having the same reference numbers. Write driver circuit 245 has an input terminal for receiving signal DIN$_X$, an enable input terminal for receiving signal $\overline{W1}$, and an output terminal for providing a signal $\text{WGDL}_Y$. Write driver circuit 246 has an input terminal for receiving signal $\text{DIN}_X$, an enable input terminal for receiving signal W1, and an output terminal for providing a signal $\overline{\text{WGDL}_X}$.

Controlled delay circuit 241 additionally includes resistor 248 to also delay a low-to-high transition of signal $D_X$ in addition to a high-to-low transition thereof. Controlled delay circuit 243 adds a delay from a high-to-low transition of $D_X$ to a high-to-low transition of $\text{WGDL}_X$, and controlled delay circuit 244 adds a delay from a low-to-high transition of $D_X$ to a high-to-low transition of $\overline{\text{WGDL}_Y}$. Data input buffer 39 provides approximately a 1.0 ns. improvement in the $t_{WHDX}/t_{DVWH}$ tradeoff.

It should be noted that other controlled delay circuits with compensation for both signal transitions are possible. Such a circuit may include both a P-channel transistor biased by signal PBIAS between the source of a P-channel transistor and $V_{DD}$ (like transistor 101 as shown in FIG. 4), and an N-channel transistor biased by voltage NBIAS between the source of an N-channel transistor and $V_{SS}$ (like transistor 133 as shown in FIG. 5). Other considerations such as area required and which transition of the input signal is critical determines whether such a two-sided delay circuit or delay circuits 82 or 125 are preferred.

Figure 9:
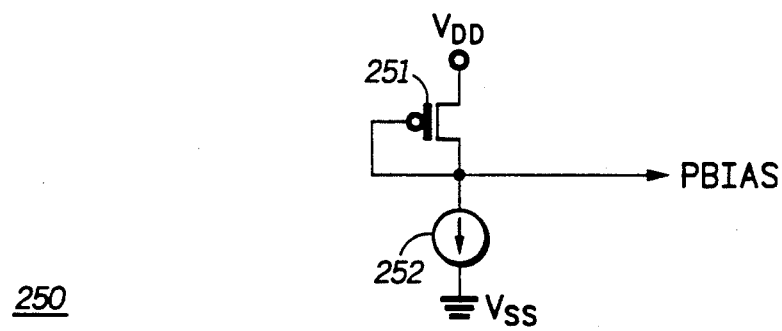
FIG. 9 illustrates a first compensation circuit for the controlled delay circuits receiving signal PBIAS.

FIG. 9 illustrates a first compensation circuit 250 for controlled delay circuit 82 of FIG. 4 and other controlled delay circuits receiving signal PBIAS. Compensation circuit 250 includes a P-channel transistor 251 and a current source 252. Transistor 251 has a source connected to $V_{DD}$, a gate, and a drain for providing signal PBIAS and connected to the gate thereof. Current source 252 has a first terminal connected to the drain of transistor 251, and a second terminal connected to $V_{SS}$.

Compensation circuit 250 provides voltage PBIAS to bias a P-channel transistor to conduct a first reference current. Current source 252 is a precision current source controlled by a bandgap reference circuit. Since the first reference current is generated by a precision current source, it is substantially independent of changes in power supply voltage, temperature, and processing. Furthermore, PBIAS is generated as that voltage which is necessary to bias transistor 251 to conduct the first reference current. PBIAS maintains this relationship despite changes in voltage, temperature, and processing. For example, if $V_{DD}$ decreases, PBIAS will similarly decrease until the gate-to-source voltage of transistor 251 is sufficient to cause transistor 251 to conduct the first reference current. Thus, PBIAS can be used to bias other P-channel transistors, such as transistor 101 in controlled delay circuit 82 of FIG. 4, to conduct a current proportional to the first reference current. In the preferred embodiment, the gate lengths of transistors 101 and 251 are equal to maintain proper tracking. It should be noted that signal PBIAS may be common to several controlled delay circuits.

Figure 10:
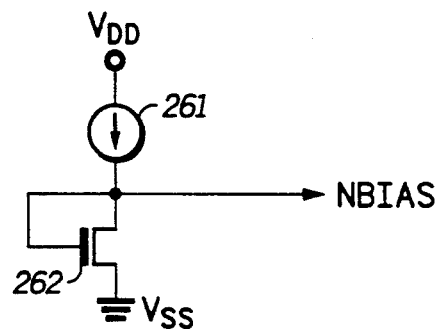
FIG. 10 illustrates a second compensation circuit for the controlled delay circuits receiving signal NBIAS.

FIG. 10 illustrates a second compensation circuit 260 for controlled delay circuit 125 of FIG. 5 and other controlled delay circuits receiving signal NBIAS. Compensation circuit 260 includes a current source 261 and an N-channel transistor 262. Current source 261 has a first terminal connected to $V_{DD}$, and a second terminal. Transistor 262 has a drain connected to the second terminal of current source 261 and providing signal NBIAS, a gate connected to the drain thereof, and a source connected to $V_{SS}$.

Compensation circuit 260 provides voltage NBIAS to bias an N-channel transistor to conduct a second reference current. Current source 261 is a precision current source controlled by a bandgap reference circuit. Since the second reference current is generated by a precision current source, it is substantially independent of changes in power supply voltage, temperature, and processing. Furthermore, NBIAS is generated as that voltage which is necessary to bias transistor 262 to conduct the second reference current. NBIAS maintains this relationship despite changes in voltage, temperature, and processing. For example, if N-channel transistor thresholds decrease, NBIAS will similarly decrease until the gate-to-source voltage of transistor 262 is small enough to cause transistor 262 just to conduct the second reference current. Thus, NBIAS can be used to bias other N-channel transistors, such as transistor 133 in controlled delay circuit 125 of FIG. 5, to conduct a current proportional to the second reference current. In the preferred embodiment, the gate lengths of transistors 133 and 262 are equal to maintain proper tracking. NBIAS may also be shared by several controlled delay circuits.

While the invention has been described in the context of a preferred embodiment, it will be apparent to those skilled in the art that the present invention may be modified in numerous ways and may assume many embodiments other than that specifically set out and described above. For example, two-sided delay circuits may be substituted where appropriate, although at a sacrifice of space. Also, other types of compensation circuits are possible, but lose their advantages over known delay circuit if PBIAS and NBIAS do not properly track changes in operating conditions. In addition, the source of the P-channel transistor in a delay circuit similar to delay circuit 82 may be connected to a voltage different than the positive power supply voltage terminal for additional control. Accordingly, it is intended by the appended claims to cover all modifications of the invention which fall within the true spirit and scope of the invention.

We claim:

1. A memory with compensation for voltage, temperature, and processing variations comprising:

input means for receiving a plurality of input signals, and for providing a plurality of internal signals in response thereto;

a memory portion for storing a plurality of memory bits at locations determined by a plurality of decoded signals; and decoding means coupled to said input means and to said memory portion for activating at least one of said plurality of decoded signals in response to said plurality of internal signals;

said input means including means for delaying at least one transition of at least one of said internal signals for a first delay, said delaying means including means for compensating said delaying means to keep said first delay substantially constant with respect to voltage, temperature, and processing variations.

2. The memory of claim 1 wherein said delaying means comprises:

a first P-channel transistor having a source coupled to a first power supply voltage terminal, a gate for receiving a bias signal, and a drain;

a second transistor having a first current electrode coupled to said drain of said first transistor, a control electrode for receiving an input signal, and a second current electrode;

a third transistor having a first current electrode coupled to said second current electrode of said second transistor, a control electrode for receiving said input signal, and a second current electrode coupled to a second power supply voltage terminal; and said compensating means generating said bias signal to bias said first P-channel transistor to conduct a reference current.

3. The memory of claim 2 wherein said compensating means comprises:

a fourth P-channel transistor having a source coupled to said first power supply voltage terminal, a gate, and a drain coupled to said gate thereof and providing said bias signal; and a precision current source having a first terminal coupled to said drain of said fourth P-channel transistor, and a second terminal coupled to said second power supply voltage terminal, said precision current source conducting a precision current from said first terminal to said second terminal thereof.

4. The memory of claim 3 wherein said precision current source is controlled by a bandgap reference circuit.

5. The memory of claim 3 wherein said first P-channel transistor and said fourth P-channel transistor have equal gate lengths.

6. The memory of claim 1 wherein said delaying means comprises:

a first transistor having a first current electrode coupled to a first power supply voltage terminal, a control electrode for receiving an input signal, and a second current electrode;

a second transistor having a first current electrode coupled to said second current electrode of said first transistor, a control electrode for receiving said input signal, and a second current electrode;

a third N-channel transistor having a drain coupled to said second current electrode of said second transistor, a gate for receiving a second bias signal, and a source coupled to a second power supply voltage terminal; and said compensating means generating said second bias signal to bias said N-channel transistor to conduct a reference current.

7. The memory of claim 6 wherein said compensating means comprises:

a precision current source having a first terminal coupled to said first power supply voltage terminal, and a second terminal, said precision current source conducting a precision current from said first terminal to said second terminal thereof; and a fourth N-channel transistor having a drain coupled to said second terminal of said precision current source and providing said second bias signal thereon, a gate connected to said drain thereof, and a source coupled to said second power supply voltage terminal.

8. The memory of claim 7 wherein said precision current source is controlled by a bandgap reference circuit.

9. The memory of claim 7 wherein said third N-channel transistor and said fourth N-channel transistor have equal gate lengths.

10. The memory of claim 1 wherein said delaying means comprises:

a first transistor having a first current electrode coupled to a first power supply voltage terminal, a control electrode for receiving an input signal, and a second current electrode;

a second transistor having a first current electrode coupled to said second current electrode of said first transistor, a control electrode for receiving said input signal, and a second current electrode;

a third N-channel transistor having a drain coupled to said second current electrode of said second transistor, a gate for receiving a first bias signal, and a source coupled to a second power supply voltage terminal;

a fourth P-channel transistor having a source coupled to said first power supply voltage terminal, a gate for receiving a second bias signal, and a drain;

a fifth transistor having a first current electrode coupled to said drain of said fourth P-channel transistor, a control electrode coupled to said second current electrode of said first transistor, and a second current electrode;

a sixth transistor having a first current electrode coupled to said second current electrode of said fifth transistor, a control electrode coupled to said second current electrode of said first transistor, and a second current electrode coupled to said second power supply voltage terminal; and said compensating means generating said first bias signal to bias said third N-channel transistor to conduct a reference current, and generating said second bias signal to bias said fourth P-channel transistor to conduct a second reference current.

11. A memory with compensation for voltage, temperature, and processing variations comprising:

an address input buffer for receiving a plurality of address signals, and for providing a plurality of corresponding buffered address signals in response, said address input buffer having means for delaying a first predetermined transition of each of said buffered address signals for a first delay, said delaying means keeping said first delay substantially constant with respect to voltage, temperature, and processing variations;

decoding means coupled to said address input buffer for activating a decoded select signal of a plurality of decoded select signals in response to said first predetermined transition of said plurality of buffered address signals; and a memory portion coupled to said decoding means, having a plurality of memory bits stored at locations determined by said at least one decoded select signal and a second address.

12. The memory of claim 11 wherein said means for delaying said first predetermined transition comprises:

means for generating a first bias signal, said first bias signal biasing a P-channel transistor to conduct a reference current;

a first P-channel transistor having a source coupled to a first power supply voltage terminal, a gate for receiving said first bias signal, and a drain;

a second transistor having a first current electrode coupled to said drain of said first transistor, a control electrode for receiving a corresponding address signal, and a second current electrode;

a third transistor having a first current electrode coupled to said second current electrode of said second transistor, a control electrode for receiving said corresponding address signal, and a second current electrode coupled to a second power supply voltage terminal.

13. The memory of claim 11 wherein said means for delaying said first predetermined transition comprises:
   means for generating a second bias signal, said second bias signal biasing an N-channel transistor to conduct a second reference current;
   a first transistor having a current electrode coupled to a first power supply voltage terminal, a control electrode for receiving an input signal, and a second current electrode;
   a second transistor having a first current electrode coupled to said second current electrode of said first transistor, a control electrode for receiving said input signal, and a second current electrode;
   a third N-channel transistor having a drain coupled to said second current electrode of said second transistor, a gate for receiving said second bias signal, and a source coupled to a second power supply voltage terminal.

14. The memory of claim 11 wherein said address input buffer receives a row address, and wherein said plurality of decoded select signals includes a plurality of row select signals.

15. A memory with compensation for voltage, temperature, and processing variations comprising:
   an address input buffer for receiving an input address, and for providing a buffered address in response;
   row decoding means coupled to said address input buffer, for selecting a word line of a plurality of word lines in response to said buffered row address;
   column decoding means for providing a write column select signal of a plurality of write column select signals in response to a column address when enabled by a first internal write signal;
   a memory portion coupled to said row decoding means and to said column decoding means, for storing a data bit at a location selected by said row decoder means and said column decoder means in response to a second internal write signal and;
   data input means for receiving a data signals for providing an internal data signal to said memory portion in response thereto when enabled by a third internal write signal;
   read/write logic means coupled to said column decoder, to said data input buffer, and to said memory portion, for receiving a plurality of control signals including a chip select signal, a write enable signal, and an output enable signal, and for providing said first, second, and third internal write signals and said select signal in response thereto; and
   said read/write logic means including means for delaying a predetermined transition of at least one of said first, second, and third internal write signals and said select signal, said delaying means including means for compensating said delaying means for voltage, temperature, and processing variations.

16. The memory of claim 15 wherein said delaying means includes means for delaying said second internal write signal on an active-to-inactive transition of said write enable signal.

17. The memory of claim 15 wherein said delaying means includes means for delaying said first internal write signal on an inactive-to-active transition of said write enable signal.

18. The memory of claim 15 wherein said delaying means includes means for delaying said third internal write signal on an active-to-inactive transition of said write enable signal.

19. The memory of claim 15 further comprising:
   data output means coupled to said read/write logic means and to said memory portion, for providing said internal data signal as a data output signal in response to a select signal;
   said memory portion providing said internal data signal during a read cycle; and
   said delaying means including means for delaying said select signal on an active-to-inactive transition of said write enable signal.

20. The memory of claim 19 wherein said delaying means includes means for delaying said select signal on an inactive-to-active transition of said chip select signal.

21. The memory of claim 15 wherein said data input means includes means for delaying said internal data signal, said means for delaying said internal data signal including means for compensating said means for delaying said internal data signal for voltage, temperature, and processing variations.

22. The memory of claim 15 wherein said address input buffer includes means for delaying a low-to-high transition of said buffered address including means for compensating said means for delaying said low-to-high transition of said buffered address for voltage, temperature, and processing variations.

23. A memory with compensation for voltage, temperature, and processing variations comprising:
   a buffer having an input for receiving an input signal and an output for providing an internal signal in response thereto;
   a memory portion for storing a plurality of memory bits at locations determined by a plurality of decoded signals; and
   a decoder coupled having an input for receiving a plurality of input signals and said internal signal, and an output coupled to said memory portion for activating at least one of said plurality of decoded signals in response to said plurality of input signals and to said internal signal;
   said buffer including delay means for delaying at least one transition of said internal signal for a first delay, and for keeping said first delay substantially constant with respect to voltage, temperature, and processing variations.

24. The memory of claim 23 wherein said delay means comprises:
   means for generating a first bias signal, said first bias signal biasing a P-channel transistor to conduct a reference current;
   a first P-channel transistor having a source coupled to a first power supply voltage terminal, a gate for receiving said first bias signal, and a drain;
   a second transistor having a first current electrode coupled to said drain of said first transistor, a control electrode for receiving a first signal corresponding to said input signal, and a second current electrode for providing a first output signal corresponding to said internal signal; and
   a third transistor having a first current electrode coupled to said second current electrode of said second transistor, a control electrode for receiving said first signal, and a second current electrode coupled to a second power supply voltage terminal.

25. The memory of claim 23 wherein said delay means comprises:

means for generating a second bias signal, said second bias signal biasing an N-channel transistor to conduct a second reference current;

a first transistor having a first current electrode coupled to a first power supply voltage terminal, a control electrode for receiving a second signal corresponding to said input signal, and a second current electrode for providing a second output signal corresponding to said internal signal;

a second transistor having a first current electrode coupled to said second current electrode of said first transistor, a control electrode for receiving said second signal, and a second current electrode; and a third N-channel transistor having a drain coupled to said second current electrode of said second transistor, a gate for receiving said second bias signal, and a source coupled to a second power supply voltage terminal.

* * * * *